United States Patent
Lin

(10) Patent No.: US 10,613,575 B1
(45) Date of Patent: Apr. 7, 2020

(54) METHOD AND APPARATUS FOR GENERATING HIGH-SPEED QUADRATURE CLOCK

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

(*) Notice: Subject to any disclaimer, the term of this patent is extended or adjusted under 35 U.S.C. 154(b) by 0 days.

(21) Appl. No.: 16/402,338

(22) Filed: May 3, 2019

(51) Int. Cl.
| | |
|---|---|
| *G06F 1/06* | (2006.01) |
| *G06F 1/10* | (2006.01) |
| *H03K 5/15* | (2006.01) |
| *H03K 3/037* | (2006.01) |
| *H03K 5/00* | (2006.01) |

(52) U.S. Cl.
CPC ............. *G06F 1/06* (2013.01); *G06F 1/10* (2013.01); *H03K 3/037* (2013.01); *H03K 5/15013* (2013.01); *H03K 2005/00286* (2013.01)

(58) Field of Classification Search
None
See application file for complete search history.

(56) References Cited

U.S. PATENT DOCUMENTS

| | | | | |
|---|---|---|---|---|
| 3,493,785 A * | 2/1970 | Rapp | ............... | H03K 3/356104 327/210 |
| 2007/0168848 A1* | 7/2007 | Tschanz | ........... | G01R 31/31726 714/798 |
| 2009/0002044 A1* | 1/2009 | Kobayashi | ......... | H01L 27/0207 327/203 |
| 2013/0129083 A1* | 5/2013 | Fujino | ..................... | G11C 7/24 380/29 |
| 2013/0187686 A1* | 7/2013 | Yuan | ..................... | H03K 3/0375 327/117 |
| 2014/0266401 A1* | 9/2014 | Park, II | .................. | H03K 3/012 327/434 |
| 2014/0354339 A1* | 12/2014 | Ko | ......................... | H03K 3/012 327/291 |
| 2016/0188049 A1* | 6/2016 | Yang | ...................... | G06F 3/044 345/174 |
| 2016/0328076 A1* | 11/2016 | Pan | ........................ | G06F 3/0416 |
| 2017/0126214 A1* | 5/2017 | Huang | .............. | H03K 3/35606 |
| 2018/0314117 A1* | 11/2018 | Huang | ................ | G11C 19/287 |
| 2019/0109586 A1* | 4/2019 | Lee | ................... | G01R 31/31727 |

* cited by examiner

*Primary Examiner* — Lincoln D Donovan
*Assistant Examiner* — Khareem E Almo
(74) *Attorney, Agent, or Firm* — McClure, Qualey & Rodack, LLP

(57) ABSTRACT

An apparatus is configured to receive a two-phase input clock and output a four-phase output clock. The apparatus includes a circuit configured in a ring topology comprising a first switch controlled by a first phase of the input clock, a first inverting amplifier, a second switch controlled by a second phase of the input clock, a second inverting amplifier, a third switch controlled by the first phase of the input clock, a third inverting amplifier, a fourth switch controlled by the second phase of the input clock, and a fourth inverting amplifier, wherein the first inverting amplifier and the third inverting amplifier share a first regenerative load that is reset upon the first phase of the input clock, and the second inverting amplifier and the fourth inverting amplifier share a second regenerative load that is reset upon the second phase of the input clock.

20 Claims, 6 Drawing Sheets

METHOD AND APPARATUS FOR GENERATING HIGH-SPEED QUADRATURE CLOCK

BACKGROUND OF THE DISCLOSURE

Field of the Disclosure

The present disclosure generally relates to quadrature clock generation, and more particularly to quadrature clock generation circuits and methods.

Description of Related Art

Quadrature clocks are widely used in radio transceivers. A schematic diagram of a prior art quadrature clock generator 100 is depicted in FIG. 1A. Quadrature clock generator 100 is configured to receive a two-phase input clock comprising a first phase CK and a second phase CB and output a four-phase output clock comprising a first phase $X_1$, a second phase $X_2$, a third phase $X_3$, and a fourth phase $X_4$. Quadrature clock generator 100 comprises a first data latch 101 and a second data latch 102 configured in a ring topology with a negative feedback, wherein each of the two data latches has two input pins labeled by "$D_+$," and "$D_-$," two output pins labeled by "$Q_+$" and "$Q_-$," and an enabling pin labeled by "E." The first (second) data latch 101 (102) receives $X_4$ ($X_1$) and $X_2$ ($X_3$) via its two input pins "$D_+$" and "$D_-$," respectively, outputs $X_1$ ($X_2$) and $X_3$ ($X_4$) via its two output pin pins "$Q_+$" and "$Q_-$," respectively, and works in accordance with CK (CB) via its "E" pin. A schematic diagram of a data latch 120 that can be instantiated to embody the two data latches 101 and 102 is shown in FIG. 1B. Data latch 120 comprises a differential pair 121, a cross-coupling pair 122, and a switch 123. Throughout this disclosure, "$V_{DD}$" denotes a supply voltage. The differential pair 121 comprises a first NMOS (n-channel metal oxide semiconductor) transistor 121A and a second NMOS transistor 121B configured to receive a differential input signal received from the two input pins "$D_+$" and "$D_-$," and output a differential output signal to the two output pins "$Q_+$" and "$Q_-$." The cross-coupling pair 122 comprises a first PMOS (p-channel metal oxide semiconductor) transistor 122A and a second PMOS transistor 122B, wherein PMOS transistor 122A is configured to receive the voltage at pin "$Q_+$" via its gate and regenerate the voltage at pin $Q_-$" via its drain, while PMOS transistor 122B is configured to receive the voltage at pin "$Q_-$" via its gate and regenerate the voltage at pin "$Q_+$" via its drain. The switch 123 comprises a third NMOS transistor 123A, controlled by a control signal received from the enabling pin "E" and configured to provide a discharge path for the differential pair 121 when enabled. When the control signal received from the enabling pin "E" is high (low), the switch 123 is switched on (off) to allow (disallow) the differential pair 121 to update a state of the cross-coupling pair 122; as such, the data latch is in an active (a frozen) state and the state of the cross-coupling pair 122 is updated (latched).

An exemplary timing diagram of quadrature clock generator 100 is shown in FIG. 1C. Here, T is a period of CK and CB. As shown, $X_1$, $X_2$, $X_3$, and $X_4$ all have a period of 2T, $X_2$ trails $X_1$ by T/2, $X_3$ trails $X_2$ by T/2, and $X_4$ trails $X_3$ by T/2. This way, a quadrature clock is generated, wherein four phases are uniformly displaced in time with 90 degrees (which is one quarter of the clock period) apart between two adjacent phases.

There is an issue with the prior art quadrature clock generator 100. The outputs of the first data latch 101 are the inputs of the second data latch 102, and vice versa. The input devices (i.e. the two NMOS transistors 121A and 121B in FIG. 1B) and the output devices (i.e. the two PMOS transistors 122A and 122B), however, are of opposite types. The input devices favor a higher crossover point for easier turn-on, while the output devices favor a lower crossover point for easier turn-on. If a design is made favorable to the output devices for the first data latch 101, the design become unfavorable to the input devices of the second data latch 102, and vice versa, since the outputs of one data latch are the inputs of the other data latch, and the input devices and the output devices are of opposite types.

Lin discloses a high-speed quadrature clock generator in U.S. Pat. No. 10,209,735 that can address the fundamental issue with the prior art quadrature clock generator 100. The circuit and method disclosed in this patent are effective, but the implementation may be considered by some to be of higher-than-desired complexity.

Therefore, what is desired is a method to overcome the fundamental dilemma of favoring input devices or output devices using a circuit of lower complexity.

SUMMARY OF THE DISCLOSURE

In an embodiment, an apparatus is configured to receive a two-phase input clock and output a four-phase output clock along with a four-phase interim clock, the apparatus comprising: a first switch configured to sample a first phase of the interim clock into a first phase of the output clock in accordance with a first phase of the input clock; a first inverting amplifier configured to receive the first phase of the output clock and output a second phase of the interim clock; a second switch configured to sample the second phase of the interim clock into a second phase of the output clock in accordance with a second phase of the input clock; a second inverting amplifier configured to receive the second phase of the output clock and output a third phase of the interim clock; a third switch configured to sample the third phase of the interim clock into a third phase of the output clock in accordance with the first phase of the input clock; a third inverting amplifier configured to receive the third phase of the output clock and output a fourth phase of the interim clock; a fourth switch configured to sample the fourth phase of the interim clock into a fourth phase of the output clock in accordance with the second phase of the input clock; a fourth inverting amplifier configured to receive the fourth phase of the output clock and output the first phase of the interim clock; a first regenerative load configured to jointly terminate the first inverting amplifier and the third inverting amplifier; a second regenerative load configured to jointly terminate the second inverting amplifier and the fourth inverting amplifier; a first reset circuit configured to reset the second phase and the fourth phase of the interim clock in accordance with the first phase of the input clock; and a second reset circuit configured to reset the first phase and the third phase of the interim clock in accordance with the second phase of the input clock.

In an embodiment, a method comprises: receiving a two-phase input clock; sampling a first phase of a four-phase interim clock into a first phase of a four-phase output clock in accordance with a first phase of the input clock; converting the first phase of the output clock into a second phase of the interim clock using a first inverting amplifier; sampling the second phase of the interim clock into a second phase of the output clock in accordance with a second phase of the input clock; converting the second phase of the output clock into a third phase of the interim clock using a second inverting amplifier; sampling the third phase of the interim clock into a third phase of the output clock in accordance with the first phase of the input clock; converting the third phase of the output clock into a fourth phase of the interim clock using a third inverting amplifier; sampling the fourth phase of the interim clock into a fourth phase of the output clock in accordance with the second phase of the input clock; converting the fourth phase of the output clock into the first phase of the interim clock using a fourth inverting amplifier; jointly terminating the first inverting amplifier and the third inverting amplifier with a first regenerative load; jointly terminating the second inverting amplifier and the fourth inverting amplifier with a second regenerative load; resetting the second phase and the fourth phase of the interim clock in accordance with the first phase of the input clock; and resetting the first phase and the third phase of the interim clock in accordance with the second phase of the input clock.

DETAILED DESCRIPTION OF THIS DISCLOSURE

The present disclosure is directed to quadrature clock generation. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "power node," "ground node," "inverter," "voltage," "CMOS (complementary metal oxide semiconductor)," "PMOS (P-channel metal oxide semiconductor) transistor," "NMOS (N-channel metal oxide semiconductor) transistor," "resistor," "capacitor," "phase," "clock," "signal," "load," "cascode," "gain," "common-source," "cross-coupling," "regenerative load," and "switch." Terms and basic concepts like these are apparent to those of ordinary skill in the art and thus will not be explained in detail here. Those of ordinary skill in the art can also recognize symbols of PMOS transistor and NMOS transistor, and identify the "source," the "gate," and the "drain" terminals thereof, and understands meanings of units such as "KOhm (kilo-Ohm)," "fF (femto-Farad)," "nm (nanometer)," and "µm (micron)" without the need of explanations.

This disclosure is presented in an engineering sense, instead of a rigorous mathematical sense. For instance, "A is equal to B" means "a difference between A and B is smaller than an engineering tolerance.

Throughout this disclosure, a ground node is used as a reference node of zero voltage (0V) electrical potential. A power node is denoted by "$V_{DD}$." A clock is a voltage signal that cyclically toggles back and forth between a low level (e.g. 0V) and a high level (e.g., the electrical potential at the power supply node "$V_{DD}$," or $V_{DD}$ for short). By way of example but not limitation, a 28 nm CMOS (complementary metal oxide semiconductor) process is used for fabrication, and "$V_{DD}$" is equal to 1.05V throughout this disclosure.

Figure 1A:
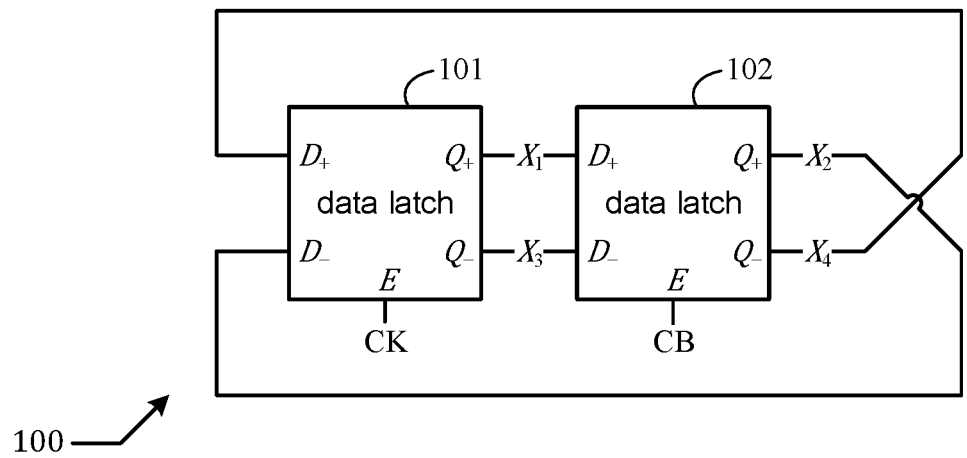
FIG. 1A shows a schematic diagram of a prior art quadrature clock generator.
Figure 1B:
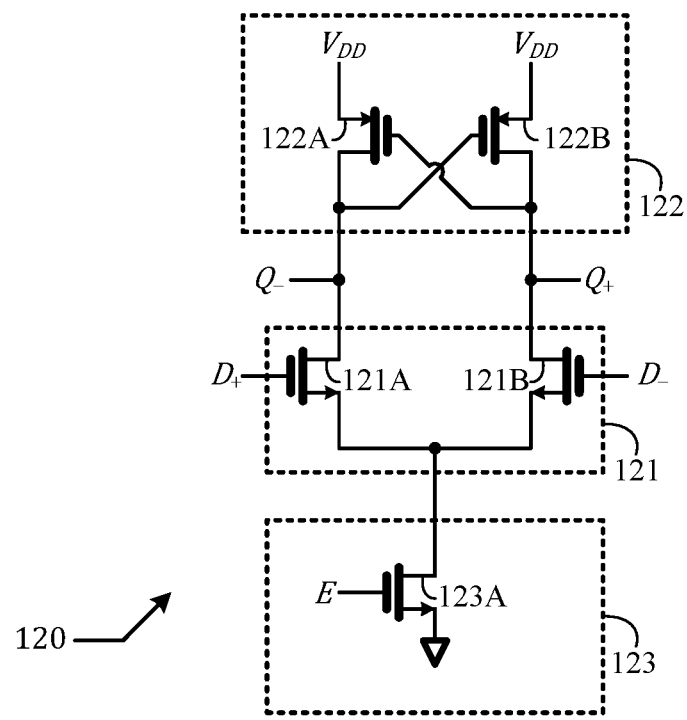
FIG. 1B shows a schematic diagram of a prior art data latch.
Figure 1C:
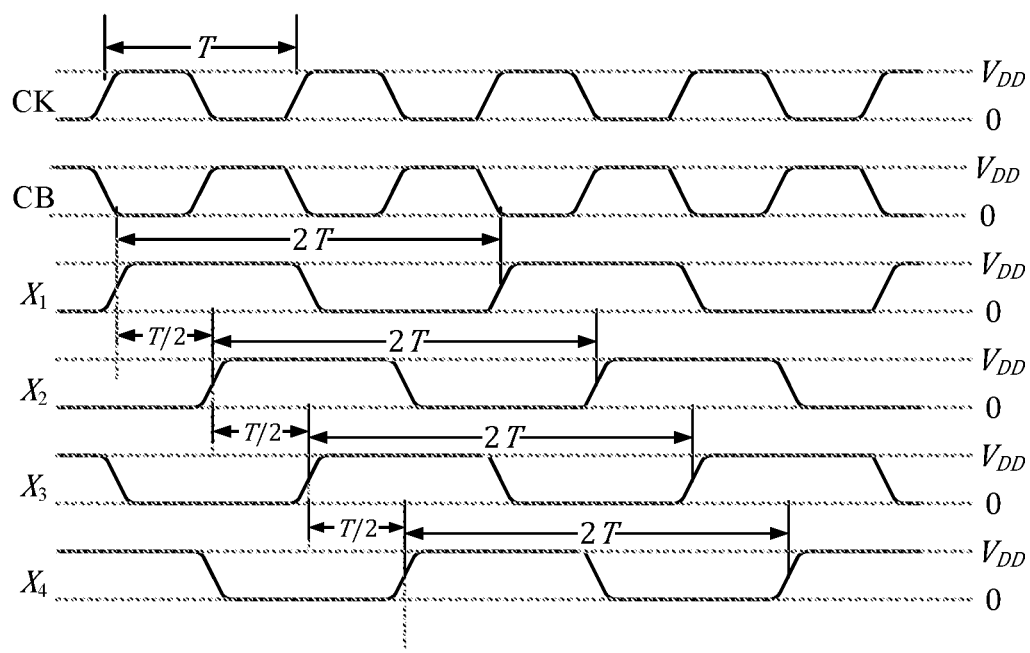
FIG. 1C shows an exemplary timing diagram of the prior art quadrature clock generator of FIG. 1A.
Figure 2:
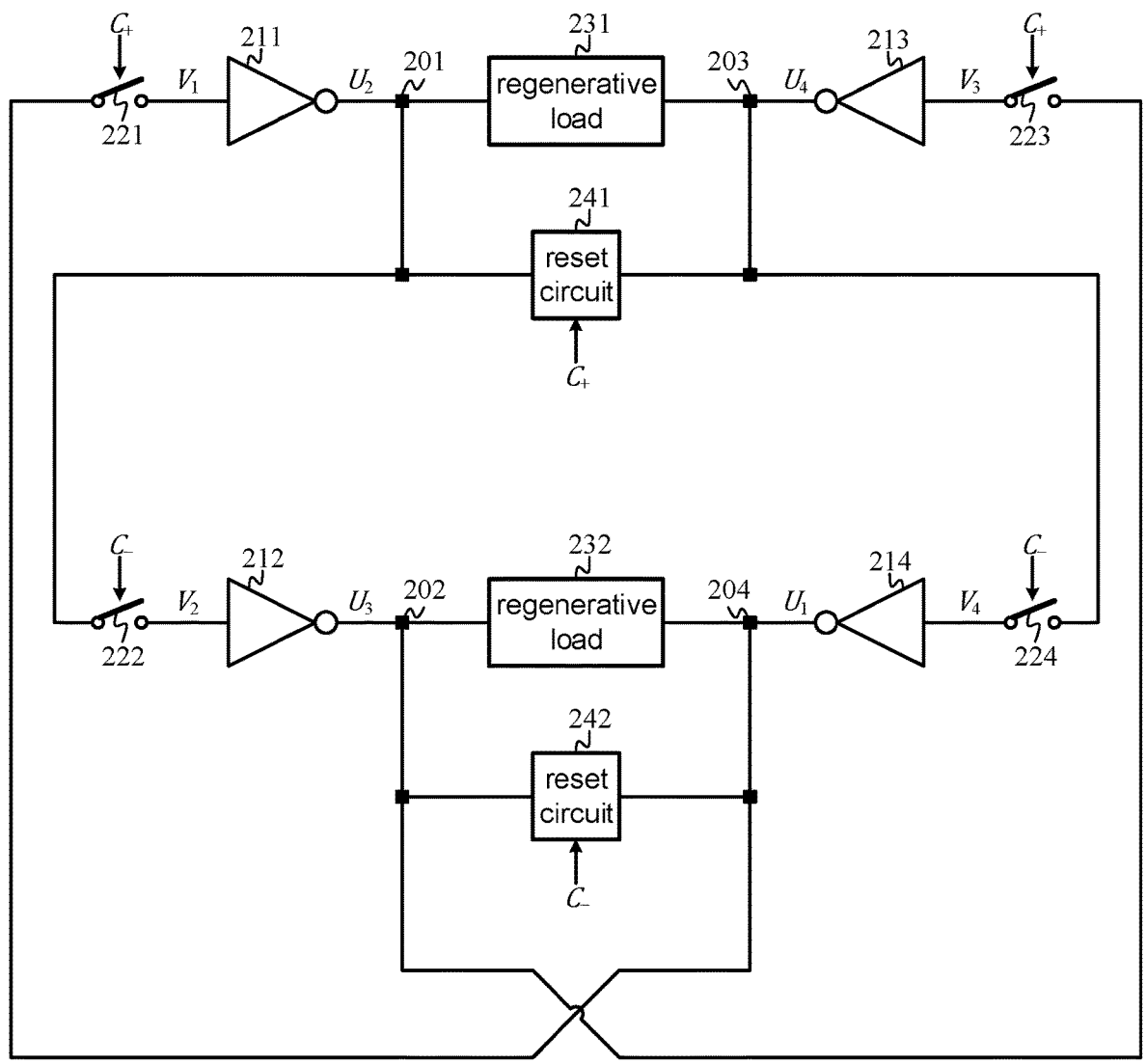
FIG. 2 shows a schematic diagram of a quadrature clock generator in accordance with a first embodiment of the present disclosure.

A schematic diagram of a quadrature clock generator 200 in accordance with an embodiment of the present invention is depicted in FIG. 2. Quadrature clock generator 200 is configured to receive a two-phase input clock comprising a first phase $C_+$ and a second phase $C_-$ and output a four-phase output clock comprising a first phase $V_1$, a second phase $V_2$, a third phase $V_3$, and a fourth phase $V_4$. A four-phase interim clock comprising a first phase $U_1$, a second phase $U_2$, a third phase $U_3$, and a fourth phase $U_4$ are also generated for inter-connection purpose. Quadrature clock generator 200 comprises: a first switch 221 configured to sample $U_1$ into $V_1$ in accordance with $C_+$; a first inverting amplifier 211 configured to receive $V_1$ and output $U_2$; a second switch 222 configured to sample $U_2$ into $V_2$ in accordance with $C_-$; a second inverting amplifier 212 configured to receive $V_2$ and output $U_3$; a third switch 223 configured to sample $U_3$ into $V_3$ in accordance with $C_+$; a third inverting amplifier 213 configured to receive $V_3$ and output $U_4$; a fourth switch 224 configured to sample $U_4$ into $V_4$ in accordance with $C_-$; a fourth inverting amplifier 214 configured to receive $V_4$ and output $U_1$; a first regenerative load 231 shared by the first inverting amplifier 211 and the third inverting amplifier 213; a second regenerative load 232 shared by the second inverting amplifier 212 and the fourth inverting amplifier 214; a first reset circuit 241 configured to reset the first regenerative load 231 in accordance with in accordance with $C_+$; and a second reset circuit 242 configured to reset the second regenerative load 232 in accordance with in accordance with $C_-$. When $C_+$ ($C_-$, $C_+$, $C_-$) is high, inverting amplifier 211 (212, 213, 214) is in a sampling phase, wherein $U_1$ ($U_2$, $U_3$, $U_4$) is sampled into $V_1$ ($V_2$, $V_3$, $V_4$) via switch 221 (222, 223, 224), and $U_2$ ($U_3$, $U_4$, $U_1$) is reset by reset circuit 241 (242, 241, 242); when $C_+$ ($C_-$, $C_+$, $C_-$) is low, inverting amplifier 211 (212, 213, 214) is in a hold phase, wherein $V_1$ ($V_2$, $V_3$, $V_4$) is frozen, and $U_2$ ($U_3$, $U_4$, $U_1$) is driven by inverting amplifier 211 (212, 213, 214) and sustained by regenerative load 231 (232, 231, 232). Therefore, the quadrature clock generator 200 works in a two-phase manner including an odd phase and an even phase in accordance with $C_+$ and $C_-$, which are complementary; in the odd phase wherein $C_+$ is high and $C_-$ is low, the first inverting amplifier 211 and the third inverting amplifier 213 are in a sampling phase, while the second inverting amplifier 212 and the fourth inverting amplifier 214 are in a hold phase; and in the even phase wherein $C_+$ is low and $C_-$ is high, the first inverting amplifier 211 and the third inverting amplifier 213 are in a hold phase, while the second inverting amplifier 212 and the fourth inverting amplifier 214 are in a sampling phase. Since the four inverting amplifiers 211, 212, 213, and 214, together with interconnection provided by the four switches 221, 222, 223, and 224, form a ring that causes $V_1$, $V_2$, $V_3$, and $V_4$ to recirculate, $V_1$, $V_2$, $V_3$, and $V_4$ are uniformly spaced in time and thus naturally form a four-phase output clock. Besides, due to the two-phase (i.e. even and odd) nature, it takes two cycles of the two-phase input clock (i.e. $C_+$ and $C_-$) to complete one cycle of the four-phase output clock ($V_1$, $V_2$, $V_3$, and $V_4$), therefore a unit cycle of the four-phase output clock is equal to two unit cycles of the two-phase input clock. In addition, for each phase of the four-phase output clock, the input devices (i.e. switches for sampling) and the output device (inverting amplifiers with regenerative load for hold) of are decoupled and thus can be optimized separately. This resolves the dilemma of prior art quadrature clock generators of the type illustrated in FIG. 1.

Figure 3:
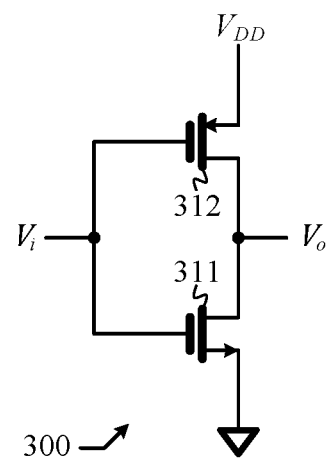
FIG. 3 shows a schematic diagram of an inverting amplifier.

A schematic diagram of an inverting amplifier 300 that can be instantiated to embody inverting amplifiers 211, 212, 213, and 214 is depicted in FIG. 3. Inverting amplifier 300, comprising a NMOS (n-channel metal oxide semiconductor) transistor 311 and a PMOS (p-channel metal oxide semiconductor) transistor 312, receives an input voltage denoted by "$V_i$" and outputs an output voltage denoted by "$V_o$." Throughout this disclosure, "$V_{DD}$" denotes a power supply node. When instantiated to embody inverting amplifier 211 (212, 213, 214), "$V_i$" represents $V_1$ ($V_2$, $V_3$, and $V_4$), while "$V_o$" represents $U_2$ ($U_3$, $U_4$, $U_1$). The source, the gate, and the drain of NMOS transistor 311 connects to ground, "$V_i$," and "$V_o$," respectively. The source, the gate, and the drain of PMOS transistor 312 connects to "$V_{DD}$," "$V_i$," and "$V_o$," respectively. Inverting amplifier 300 is well known to those of ordinary skills in the art and thus not described in detail here. In an alternative embodiment, PMOS transistor 312 is removed but NMOS transistor 311 remains. In a yet alternative embodiment, NMOS transistor 311 is removed but PMOS transistor 312 remains.

Figure 4:
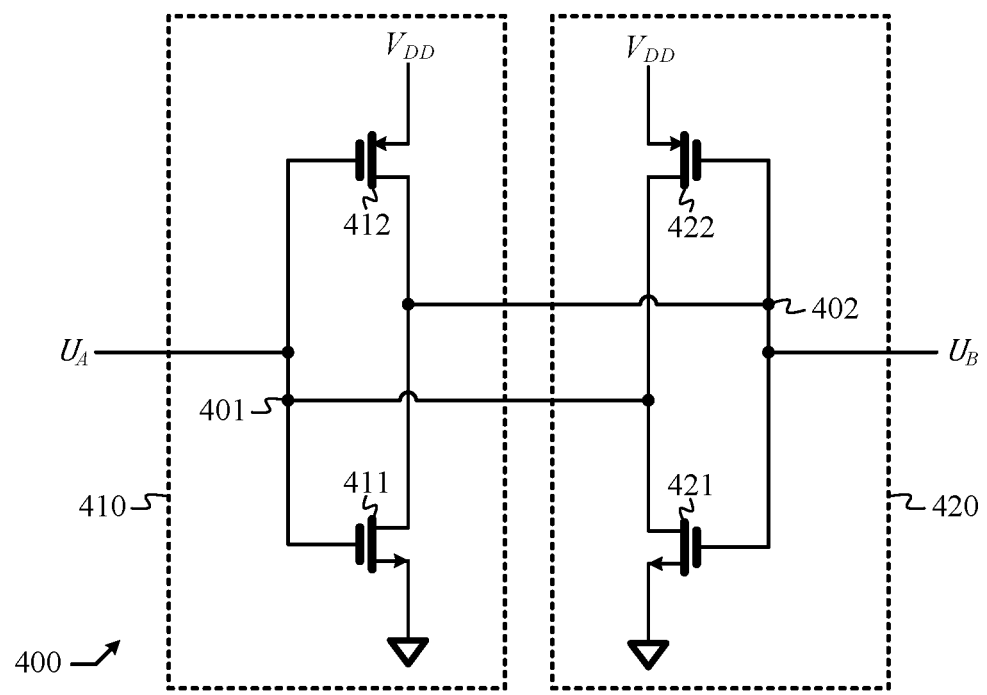
FIG. 4 shows a schematic diagram of a regenerative load.

A schematic diagram of a regenerative load 400 that can be instantiated to embody regenerative load 231 and 232 is depicted in FIG. 4. Regenerative load 400 comprises a first common-source amplifier 410 and a second common-source amplifier 420 configured to provide cross-coupling between node 401 and node 402 to boost an impedance between node 401 and node 402. The first common-source amplifier 410 comprises a first NMOS transistor 411 and a first PMOS transistor 412 configured to jointly receive voltage $U_A$ from node 401 and output voltage $U_B$ to node 402. The second common-source amplifier 420 comprises a second NMOS transistor 421 and a second PMOS transistor 422 configured to jointly receive voltage $U_B$ from node 402 and output voltage $U_A$ to node 401. When instantiated to embody regenerative load 231 (232), node 401 represents node 201 (202), node 402 represents node 203 (204), $U_A$ represents $U_2$ ($U_3$), and $U_B$ represents $U_4$ ($U_1$). Common-source amplifiers 410 and 420 are well known to those of ordinary skills in the art and thus not described in detail here. In an alternative embodiment, NMOS transistors 411 and 421 are removed, but PMOS transistors 412 and 422 remain. However, this alternative embodiment cannot be used if NMOS transistor 311 in FIG. 3 is also removed when instantiating inverting amplifier 300 to embody inverting amplifiers 211, 212, 213, and 214, because otherwise there will be no NMOS transistor available for pulling down $U_1$, $U_2$, $U_2$, or $U_4$. In a yet alternative embodiment, PMOS transistors 412 and 422 are removed, but NMOS transistors 411 and 421 remain. However, this yet alternative embodiment cannot be used if PMOS transistor 312 in FIG. 3 is also removed when instantiating inverting amplifier 300 to embody inverting amplifiers 211, 212, 213, and 214, because otherwise there will be no PMOS transistor available for pulling up $U_1$, $U_2$, $U_2$, or $U_4$.

In FIG. 2, it is shown that switches 221, 222, 223, and 224 are controlled by $C_+$, $C_-$, $C_+$, and $C_-$, respectively. This is according to an "active high" embodiment and means that switch 221 (222, 223, 224) is turned on when $C_+$ ($C_-$, $C_+$, $C_-$) is high, and turned off otherwise. If an "active low" embodiment is used, then FIG. 2 must be redrawn to show that switches 221, 222, 223, and 224 are controlled by $C_-$, $C_+$, $C_-$, and $C_+$, respectively; in this "active low" embodiment, switch 221 (222, 223, 224) is turned on when $C_-$ ($C_+$, $C_-$, $C_+$) is low, and turned off otherwise. Since $C_-$ always accompanies with $C_+$ and is complementary to $C_+$, the "active high" and "active low" embodiments indeed lead to the same result that switch 221 (222, 223, 224) is turned on when $C_+$ ($C_-$, $C_+$, $C_-$) is high. Therefore, the way FIG. 2 is drawn indeed applies to both "active high" and "active low" embodiments. Also, although $C_-$ ($C_+$, $C_-$, $C_+$) is not explicitly shown as a control signal for switch 221 (222, 223, 224), it must be understood that $C_-$ ($C_+$, $C_-$, $C_+$) is an implicit control signal for switch 221 (222, 223, 224) in an "active low" embodiment.

Figure 5:
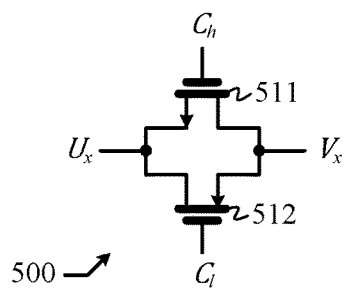
FIG. 5 shows a schematic diagram of a switch circuit.

A schematic diagram of a switch 500 that can be instantiated to embody switches 221, 222, 223, and 224 is shown in FIG. 5. Switch 500 comprises a NMOS transistor 511 and a PMOS transistor 512 controlled by $C_h$ and $C_i$, respectively, and configured to provide a provide interconnection between $U_x$ and $V_x$ in accordance with a logical state of $C_h$ and $C_i$. Here, NMOS transistor 511 embodies an "active high" switch that is turned on when $C_h$ is high and turned off otherwise, while PMOS transistor 512 embodies an "active low" switch that is turned on when $C_i$ is low and turned off otherwise. $C_h$ and $C_i$ are complementary, therefore NMOS transistor 511 and PMOS transistor 512 are always either both on or both off. When instantiated to embody switch 221 (222, 223, 224), $C_h$ represents $C_+$ ($C_-$, $C_+$, $C_-$), $C_i$ represents $C_-$ ($C_+$, $C_-$, $C_+$), $U_x$ represents $U_1$ ($U_2$, $U_3$ or $U_4$), and $V_x$ represents $V_1$ ($V_2$, $V_3$, or $V_4$). Note that the switch 500 is also known as a "transmission gate" circuit.

The switch 500 of FIG. 5 can also be instantiated to embody reset circuits 241 and 242. When instantiated to embody reset circuit 241 (242), $C_h$ represents $C_+$ ($C_-$), $C_i$ represents $C_-$ ($C_+$), $U_x$ represents $U_2$ ($U_3$), and $V_x$ represents $U_4$ ($U_1$). When $C_h$ is high and $C_i$ is low, $U_x$ and $V_x$ are pulled toward being equal. That is, when $C_+$ ($C_-$) is high and $C_-$ ($C_+$) is low, $U_2$ ($U_3$) and $U_4$ ($U_1$) are pulled toward being equal. As will be shown in simulation waveform, $U_2$ ($U_3$) and $U_4$ ($U_1$) are complementary, therefore pulling $U_2$ ($U_3$) and $U_4$ ($U_1$) toward being equal is functionally a reset. In an alternative embodiment, PMOS transistor 512 is removed but NMOS transistor 511 remains. In a yet alternative embodiment, NMOS transistor 511 is removed by PMOS transistor 512 remains.

By way of example but not limitation, in an embodiment, quadrature clock generator 200 is fabricated using a 28 nm CMOS (complementary metal oxide semiconductor) process; inverting amplifier 300 is instantiated to embody inverting amplifiers 211, 212, 213, and 214; the W/L (width/length) of NMOS transistors 311 is 4 μm/30 nm, but PMOS transistor 312 is removed; the regenerative load 400 is instantiated to embody regenerative loads 231 and 232; the W/L is 5.6 μm/30 nm for both of PMOS transistors 422 and 412, but NMOS transistors 411 and 421 are removed; switch 500 is instantiated to embody switches 221, 222, 223, and 224, with the W/L of NMOS transistor 511 being 2.16 μm/30 nm and the W/L of PMOS transistor being 3 μm/30 nm;

switch 500 is instantiated to embody reset circuits 241 and 242, with the W/L of PMOS transistor 512 being 2.8 μm/30 nm but NMOS transistor 511 being removed.

Figure 6:
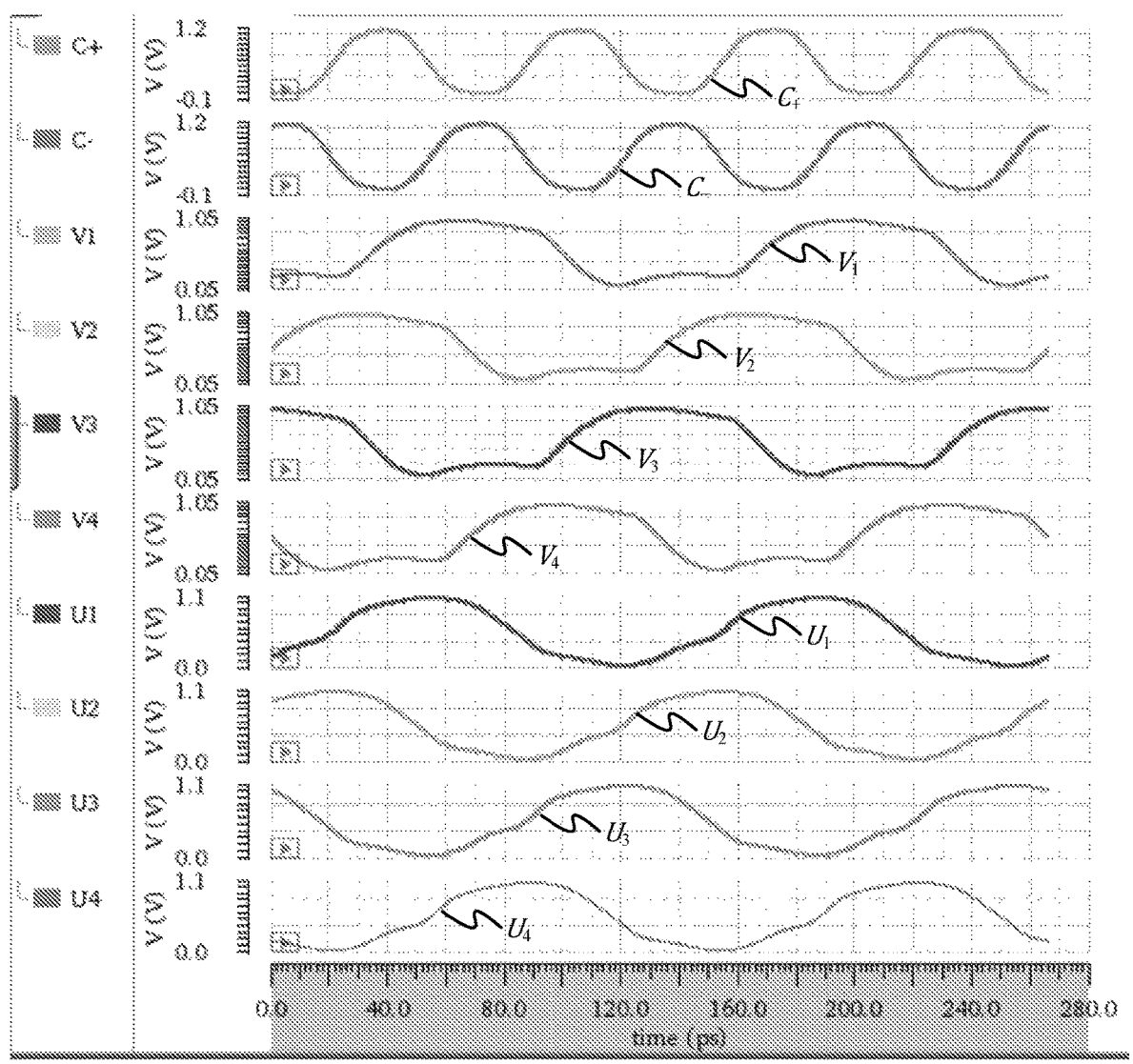
FIG. 6 shows a simulation result.

A simulation result is shown in FIG. 6. Here, waveforms of $C_+$, $C_-$, $V_1$, $V_2$, $V_3$, $V_4$, $U_1$, $U_2$, $U_3$, and $U_4$ are shown. $C_+$ and $C_-$ are complementary and form a two-phase clock at 15 GHz. $V_1$, $V_2$, $V_3$, and $V_4$ are uniformly displaced in time and form a four-phase clock at 7.5 GHz. $U_1$, $U_2$, $U_3$, and $U_4$ are also uniformly displaced in time and form a four-phase clock at 7.5 GHz. $U_1$ and $U_3$ are complementary, while $U_2$ and $U_4$ are complementary. Note that if signal X and signal Y are complementary, when X goes high, Y will go low, and vice versa.

Figure 7:
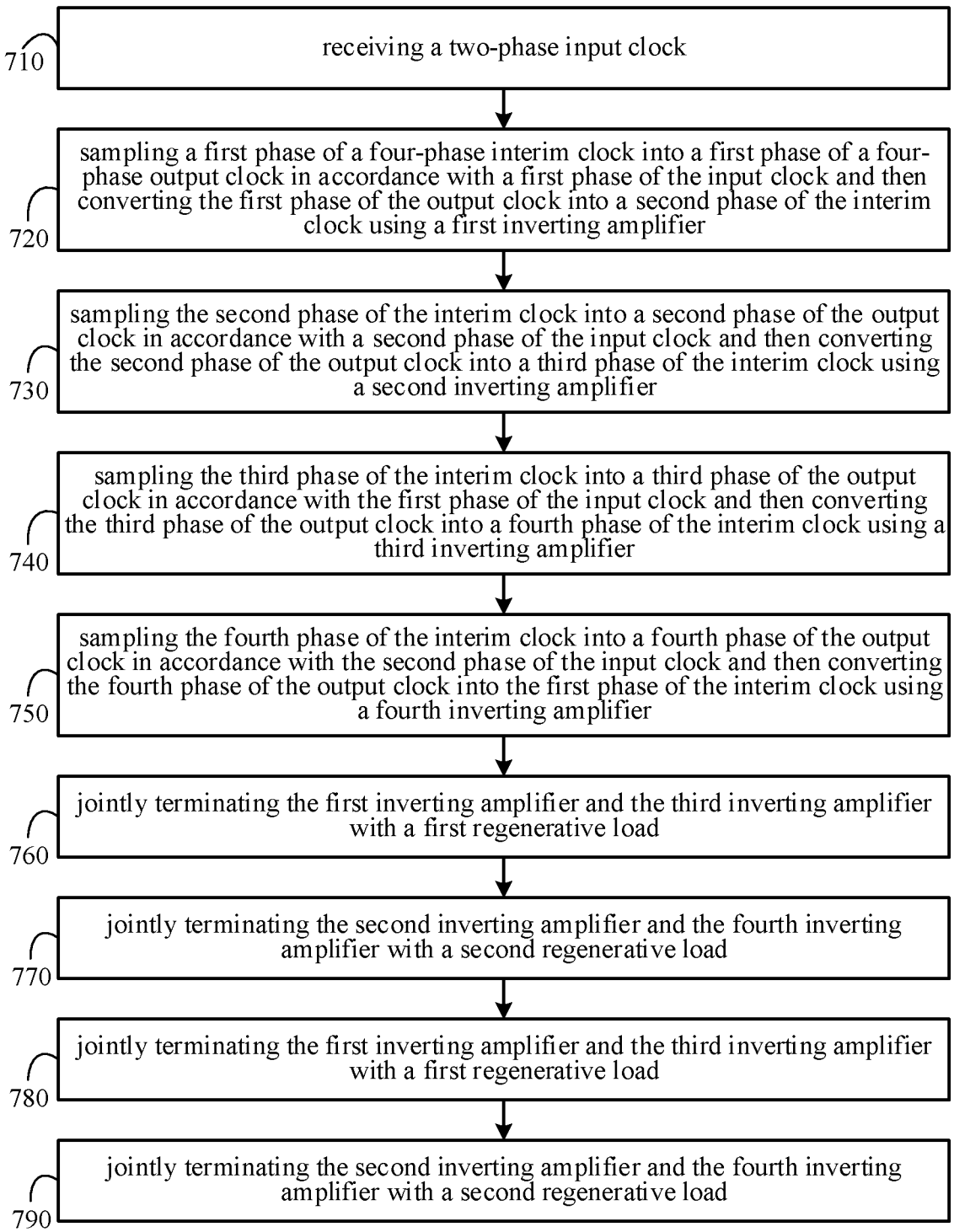
FIG. 7 shows a flow diagram of a method in accordance with an embodiment of the present invention.

As shown in a flow diagram 700 depicted in FIG. 7, a method in accordance with an embodiment of the present disclosure comprises: (step 710) receiving a two-phase input clock; (step 720) sampling a first phase of a four-phase interim clock into a first phase of a four-phase output clock in accordance with a first phase of the input clock and then converting the first phase of the output clock into a second phase of the interim clock using a first inverting amplifier; (step 730) sampling the second phase of the interim clock into a second phase of the output clock in accordance with a second phase of the input clock and then converting the second phase of the output clock into a third phase of the interim clock using a second inverting amplifier; (step 740) sampling the third phase of the interim clock into a third phase of the output clock in accordance with the first phase of the input clock and then converting the third phase of the output clock into a fourth phase of the interim clock using a third inverting amplifier; (step 750) sampling the fourth phase of the interim clock into a fourth phase of the output clock in accordance with the second phase of the input clock and then converting the fourth phase of the output clock into the first phase of the interim clock using a fourth inverting amplifier; (step 760) jointly terminating the first inverting amplifier and the third inverting amplifier with a first regenerative load; (step 770) jointly terminating the second inverting amplifier and the fourth inverting amplifier with a second regenerative load; (step 780) resetting the second phase and the fourth phase of the interim clock in accordance with the first phase of the input clock; and (step 790) resetting the first phase and the third phase of the interim clock in accordance with the second phase of the input clock.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. An apparatus configured to receive a two-phase input clock and output a four-phase output clock along with a four-phase interim clock, the apparatus comprising:
   a first switch configured to sample a first phase of the interim clock into a first phase of the output clock in accordance with a first phase of the input clock;
   a first inverting amplifier configured to receive the first phase of the output clock and output a second phase of the interim clock;
   a second switch configured to sample the second phase of the interim clock into a second phase of the output clock in accordance with a second phase of the input clock;
   a second inverting amplifier configured to receive the second phase of the output clock and output a third phase of the interim clock;
   a third switch configured to sample the third phase of the interim clock into a third phase of the output clock in accordance with the first phase of the input clock;
   a third inverting amplifier configured to receive the third phase of the output clock and output a fourth phase of the interim clock;
   a fourth switch configured to sample the fourth phase of the interim clock into a fourth phase of the output clock in accordance with the second phase of the input clock;
   a fourth inverting amplifier configured to receive the fourth phase of the output clock and output the first phase of the interim clock;
   a first regenerative load configured to jointly terminate the first inverting amplifier and the third inverting amplifier;
   a second regenerative load configured to jointly terminate the second inverting amplifier and the fourth inverting amplifier;
   a first reset circuit configured to reset the second phase and the fourth phase of the interim clock in accordance with the first phase of the input clock; and
   a second reset circuit configured to reset the first phase and the third phase of the interim clock in accordance with the second phase of the input clock;
   wherein, the first and second reset circuits directly receive the first and second phases of the input clock, respectively, and the first and second reset circuits connect across the first regenerative load and second regenerative load, respectively.

2. The apparatus of claim 1, wherein each of the first, second, third, and fourth inverting amplifier is instantiated from a same amplifier circuit.

3. The apparatus of claim 2, wherein each of the first, second, third, and fourth inverting amplifier comprises a NMOS (n-channel metal oxide semiconductor) transistor configured to receive an input at its gate and output an output at its drain.

4. The apparatus of claim 2, wherein each of the first, second, third, and fourth inverting amplifier comprises a PMOS (p-channel metal oxide semiconductor) transistor configured to receive an input at its gate and output an output at its drain.

5. The apparatus of claim 1, wherein each of the first switch, the second switch, the third switch, and the fourth switch is instantiated from the same transmission gate circuit.

6. The apparatus of claim 5, wherein each of the first regenerative load and the second regenerative load is instantiated from a circuit of a cross-coupling common-source amplifier pair.

7. The apparatus of claim 6, wherein the cross-coupling common-source amplifier pair comprises a first NMOS (n-channel metal oxide semiconductor) transistor and a second NMOS transistor, wherein a gate of the first NMOS transistor connects to a drain of the second NMOS transistor, while a gate of the second NMOS transistor connects to a drain of the first NMOS transistor.

8. The apparatus of claim 6, wherein the cross-coupling common-source amplifier pair comprises a first PMOS (p-channel metal oxide semiconductor) transistor and a second PMOS transistor, wherein a gate of the first PMOS transistor connects to a drain of the second PMOS transistor, while a gate of the second PMOS transistor connects to a drain of the first PMOS transistor.

9. The apparatus of claim 1, wherein each of the first reset circuit and the second reset circuit is instantiated from a switch circuit.

10. The apparatus of claim 9, wherein the switch circuit comprises a MOS (metal-oxide semiconductor) controlled by one of the first phase and the second phase of the input clock.

11. A method comprising:
receiving a two-phase input clock;
sampling a first phase of a four-phase interim clock into a first phase of a four-phase output clock using a first switch in accordance with a first phase of the input clock and then converting the first phase of the output clock into a second phase of the interim clock using a first inverting amplifier;
sampling the second phase of the interim clock into a second phase of the output clock using a second switch in accordance with a second phase of the input clock and then converting the second phase of the output clock into a third phase of the interim clock using a second inverting amplifier;
sampling the third phase of the interim clock into a third phase of the output clock using a third switch in accordance with the first phase of the input clock and then converting the third phase of the output clock into a fourth phase of the interim clock using a third inverting amplifier;
sampling the fourth phase of the interim clock into a fourth phase of the output clock using a fourth switch in accordance with the second phase of the input clock and then converting the fourth phase of the output clock into the first phase of the interim clock using a fourth inverting amplifier; (step 760) jointly terminating the first inverting amplifier and the third inverting amplifier with a first regenerative load;
jointly terminating the second inverting amplifier and the fourth inverting amplifier with a second regenerative load;
resetting the second phase and the fourth phase of the interim clock in accordance with the first phase of the input clock using a first reset circuit; and
resetting the first phase and the third phase of the interim clock in accordance with the second phase of the input clock using a second reset circuit;
wherein, the first and second reset circuits directly receive the first and second phases of the input clock, respectively, and the first and second reset circuits connect across the first regenerative load and second regenerative load, respectively.

12. The method of claim 11, wherein each of the first, second, third, and fourth inverting amplifier is instantiated from the same amplifier circuit.

13. The method of claim 12, wherein each of the first, second, third, and fourth amplifier comprises a NMOS (n-channel metal oxide semiconductor) transistor configured to receive an input at its gate and output an output at its drain.

14. The method of claim 12, wherein each of the first, second, third, and fourth amplifier comprises a PMOS (p-channel metal oxide semiconductor) transistor configured to receive an input at its gate and output an output at its drain.

15. The method of claim 11, wherein each of the first switch, the second switch, the third switch, and the fourth switch is instantiated from the same transmission gate circuit.

16. The method of claim 15, wherein each of the first regenerative load and the second regenerative load is instantiated from a circuit of a cross-coupling common-source amplifier pair.

17. The method of claim 16, wherein the cross-coupling common-source amplifier pair comprises a first NMOS (n-channel metal oxide semiconductor) transistor and a second NMOS transistor, wherein a gate of the first NMOS transistor connects to a drain of the second NMOS transistor, while a gate of the second NMOS transistor connects to a drain of the first NMOS transistor.

18. The method of claim 16, wherein the cross-coupling common-source amplifier pair comprises a first PMOS (p-channel metal oxide semiconductor) transistor and a second PMOS transistor, wherein a gate of the first PMOS transistor connects to a drain of the second PMOS transistor, while a gate of the second PMOS transistor connects to a drain of the first PMOS transistor.

19. The method of claim 11, wherein each of the first reset circuit and the second reset circuit is instantiated from a switch circuit.

20. The method of claim 19, wherein the switch circuit comprises a MOS (metal-oxide semiconductor) controlled by one of the first phase and the second phase of the input clock.

* * * * *